(12) United States Patent
Krieger et al.

(10) Patent No.: US 7,026,702 B2
(45) Date of Patent: Apr. 11, 2006

(54) MEMORY DEVICE

(75) Inventors: Juri Heinrich Krieger, Brookline, MA (US); Nikolay Fedorovich Yudanov, Brookline, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/776,850

(22) Filed: Feb. 11, 2004

(65) Prior Publication Data

US 2004/0159835 A1 Aug. 19, 2004

Related U.S. Application Data

(63) Continuation-in-part of application No. PCT/RU01/00334, filed on Aug. 13, 2001.

(51) Int. Cl.
*H01L 31/06* (2006.01)
*H01L 31/00* (2006.01)

(52) U.S. Cl. .................. 257/464; 257/448; 257/459

(58) Field of Classification Search ................ 257/446, 257/448, 459, 464
See application file for complete search history.

(56) References Cited

U.S. PATENT DOCUMENTS

| | | | |
|---|---|---|---|
| 4,652,894 A | | 3/1987 | Potember et al. |
| 4,663,270 A | | 5/1987 | Potember et al. |
| 5,579,199 A | | 11/1996 | Kawamura et al. |
| 5,589,692 A | | 12/1996 | Reed |
| 5,841,180 A | * | 11/1998 | Kobayashi et al. ........ 257/448 |
| 5,942,775 A | * | 8/1999 | Yiannoulos ................ 257/292 |
| 6,055,180 A | | 4/2000 | Gudesen et al. |
| 6,208,553 B1 | | 3/2001 | Gryko et al. |
| 6,212,093 B1 | | 4/2001 | Lindsey |
| 6,232,626 B1 | * | 5/2001 | Rhodes ........................ 257/292 |
| 6,245,601 B1 | * | 6/2001 | Kobayashi et al. ......... 438/155 |
| 6,249,085 B1 | * | 6/2001 | Arai ............................ 313/506 |
| 6,272,038 B1 | | 8/2001 | Clausen et al. |
| 6,288,487 B1 | * | 9/2001 | Arai ............................ 313/506 |
| 6,314,019 B1 | | 11/2001 | Kuekes et al. |
| 6,320,200 B1 | | 11/2001 | Reed et al. |
| 6,324,091 B1 | | 11/2001 | Gryko et al. |
| 6,348,700 B1 | | 2/2002 | Ellenbogen et al. |
| 6,404,126 B1 | * | 6/2002 | Arai et al. .................. 313/503 |
| 6,649,950 B1 | * | 11/2003 | He et al. ..................... 257/292 |
| 6,768,157 B1 | * | 7/2004 | Krieger et al. ............. 257/314 |
| 6,838,742 B1 | * | 1/2005 | Rhodes ........................ 257/448 |
| 2003/0155602 A1 | * | 8/2003 | Krieger et al. ............. 257/306 |
| 2003/0173612 A1 | * | 9/2003 | Krieger et al. ............. 257/304 |
| 2003/0178667 A1 | * | 9/2003 | Krieger et al. ............. 257/306 |

(Continued)

FOREIGN PATENT DOCUMENTS

RU 99101838 12/2000

(Continued)

OTHER PUBLICATIONS

International Search Report, PCT/RU01/00334, Feb. 21, 2002.

*Primary Examiner*—Ngân V. Ngô
(74) *Attorney, Agent, or Firm*—Amin & Turocy, LLP

(57) ABSTRACT

Systems and methodologies for fabrication of a memory cell or array are disclosed. The memory cell employs a functional zone with passive and active layers. Such passive and active layers facilitate electron migration, and allow a plurality of states for the memory cell. A memory device formed in accordance with the disclosed methodology can include a top-electrode formed over the functional layer, which in turn over lays a lower conductive layer.

32 Claims, 9 Drawing Sheets

U.S. PATENT DOCUMENTS

2004/0026714 A1* 2/2004 Krieger et al. .............. 257/200
2004/0026729 A9* 2/2004 Krieger et al. .............. 257/306
2004/0146786 A1* 7/2004 Sato et al. .................. 429/326
2005/0211978 A1* 9/2005 Bu et al. ..................... 257/40

FOREIGN PATENT DOCUMENTS

WO     WO 03/017282 A1    2/2003

* cited by examiner

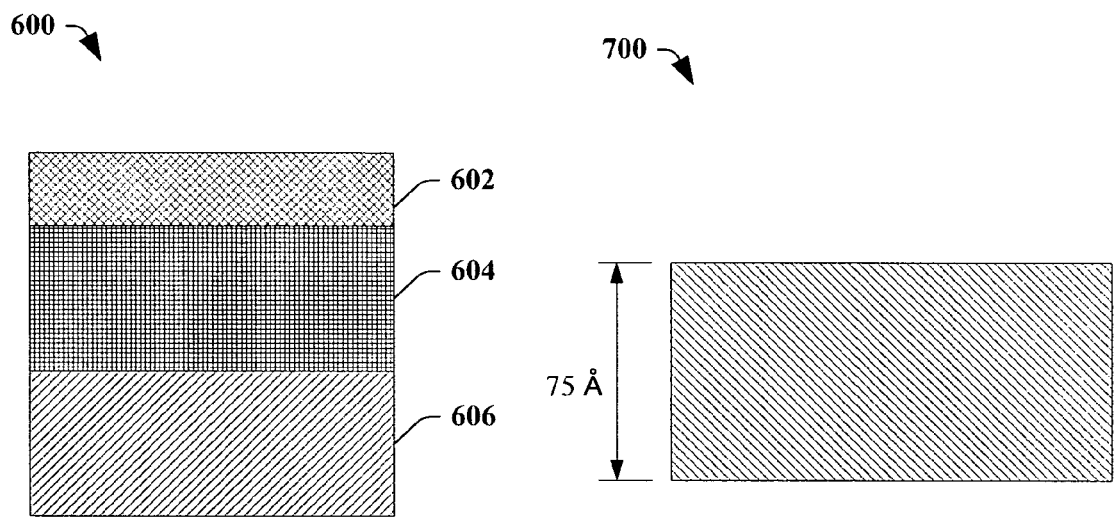
Fig. 6
Fig. 7
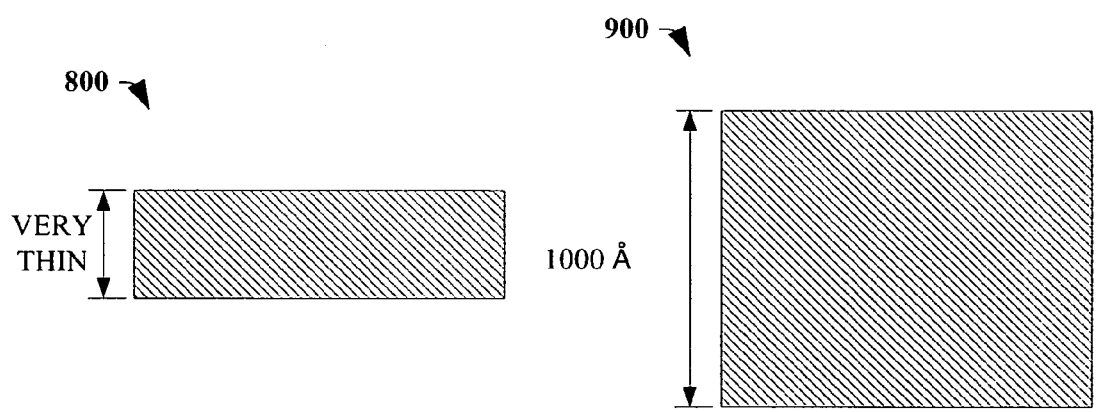
Fig. 8
Fig. 9

MEMORY DEVICE

CROSS REFERENCE TO RELATED APPLICATION

This application is a Continuation-in-Part of PCT application PCT/RU01/00334 filed Aug. 13, 2001.

FIELD OF THE INVENTION

The present invention relates generally to memory devices and, in particular, to memory cells having functional layer(s) with a mechanism for electronic switching and resistance change, which is indicative of data storage.

BACKGROUND OF THE INVENTION

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies associated with conventional systems.

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter.

The present invention provided for systems and methods of fabricating semiconductor memory devices with a layered functional zone structure. Such functional layer facilitates migration of charges, (e.g. electrons, holes), and allows various impedance states for the memory cell. The layered structure can include selective conductive layers), active/passive layers, and barrier layers. Accordingly, a memory cell with a short resistance switch time and low operating voltages can be created, which is at the same time compatible with manufacturing methodologies for existing semiconductors.

According to one aspect of the present invention a top and bottom electrode sandwich various film layers of functional or selective conductive, passive and active layers to form a memory cell. Such memory cell when subjected to an external stimulus, e.g. bias voltages, light radiation and the like, can be programmed (e.g. write/erase) via a desired impedance state induced in the memory cell. The desired impedance state represents one or more bits of information, and does not require a constant power supply or refresh cycles to maintain the desired information. Accordingly, the impedance state of the selectively conductive media can be read by applying a further external stimulus, such as an electric current. As with the written impedance state, the read impedance state represents one or more bits of information. Switching between the various states (e.g. read or write) can be a function of the electrical field created in such memory cell. In general, such formed electrical field can in turn be a function of the thickness of layers sandwiched between the top and bottom electrodes, and the applied electrical voltage between the first and second electrodes.

According to another aspect of the present invention, a multi-cell memory component can be constructed having two or more non metal electrodes, e.g. amorphous carbon material, which sandwich therebetween the passive and the active layer. In addition, the active layer can comprise various types of conjugated polymers, such as redox-switchable molecular units. Under high external electrical field (e.g. 1–10V) electrons or holes can migrate from switchable molecular units to chains of the conjugated polymers. Such migration of charges can affect a conductivity of the material, and thus change a resistance of the memory cell. The state of the memory cell can then be read by applying a low external electrical voltage, (e.g. 0.05–0.1 V.)

According to one aspect of the present invention, the passive layer can be deposited upon the lower electrode layer via vacuum thermal evaporation, sputtering, or plasma enhanced chemical vapor deposition (PECVD) utilizing a metal organic (MO) precursor. The deposition process can be monitored and controlled to facilitate, among other things, depositing the conductivity facilitating compound to a desired thickness.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

BRIEF DESCRIPTION OF THE DRAWINGS

FIG. 6 is a schematic diagram of a passive layer that can be employed in a memory device in accordance with an aspect of the present invention.

FIG. 7 is a schematic diagram illustrating an organic polymer layer as part of an active layer formed by a CVD process in accordance with an aspect of the present invention.

FIG. 8 is a schematic diagram illustrating another organic polymer layer formed by a CVD process in accordance with an aspect of the present invention.

FIG. 9 is a schematic diagram of yet another organic polymer layer formed by a CVD process in accordance with an aspect of the present invention.

DETAILED DESCRIPTION OF THE INVENTION

Figure 1:
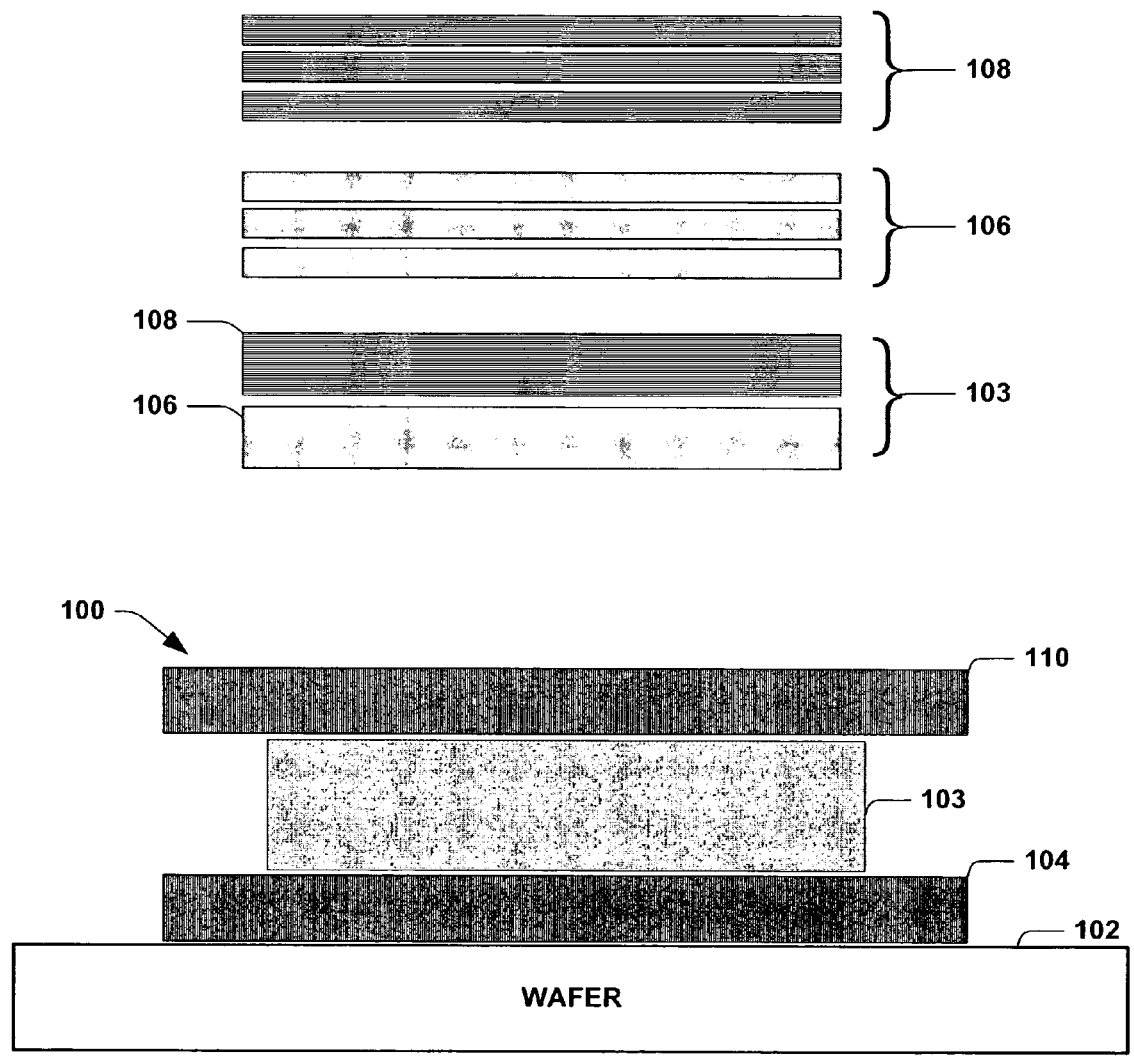
FIG. 1 is a schematic diagram illustrating a basic organic memory cell and its various sub layers in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, to one skilled in the art that one or more aspects of the present invention may be practiced with a lesser degree of these specific details. In other instances, known structures and devices may be shown in block diagram form in order to facilitate describing one or more aspects of the present invention.

The invention is based on the problem of creating an essentially new type of memory cell which is capable of storing several bits of information, which has short resistance switch time and low operating voltages and at the same time allow to combine its manufacturing technology with that of the modern semiconductors.

This problem is resolved as follows. The memory cell has a three-layer structure consisting of two electrodes with a functional zone between them. This is achieved by making the electrodes out of metallic and/or semiconductor and/or conductive polymer and/or optically transparent oxide or sulfide material, making the functional zone out of organic, metalorganic and non-organic materials, with different types of active elements built into the materials' molecular and/or crystalline structure, as well as by combining the materials with each other and/or with clusters based on them that change their; state, electrical charge and/or position under influence of an external electric field and/or light radiation.

The described memory cell structure allows creating a memory element with single bit and multi-bit information writing, storing and reading methods. At the same time information is stored as the functional zone resistance value. For a memory cell with single bit storing mode the resistance value has two levels: high (e.g. representing 0) and low (e.g. representing 1), while for a memory cell with multi-bit storing mode the resistance value has several levels corresponding to specific bits of information. For example, for a two-bit cell there are four levels of its resistance, for a four bit cell sixteen levels, and so forth. The memory cell is advantageously distinctive of the currently used elements in that it does not require non-interrupted power supply while storing information. The information storage time depends on the memory cell structure, on material used for the functional zone, and on recording mode. The time can vary from several seconds (can be used for dynamic memory) to several years (can be used for long term memory, such as Flash memory).

The memory cell functional zone may contain an active layer based on organic and metalorganic conjugate polymers with active elements built into the main circuit and/or connected to the circuit or to the plane and/or built into the structure, with the elements forming or not forming a light emitting structure, or of an active layer based on organic, metalorganic and non-organic materials with instilled positive or negative ions, including molecular ions, and/or with instilled clusters based on solid electrolytes or with molecules and/or ions with an electric dipole element, and/or with clusters based on solid polymer and non-organic ferroelectrics, and/or with donor and acceptor molecules, and/or with organic and/or non-organic salts and/or acids and/or alkalis and/or water molecules which can dissociate in an electric field and/or under light radiation, and/or with non-organic and/or metalorganic and/or organic salts and/or molecules with variable valency of metals or atomic groups they contain. The described implementation of a functional zone allows to create a structure capable of changing the active layer resistance and/or forming high conductivity areas or lines in the active layer under external electric and/or light radiation effect on the memory cell and retaining this state for a long time without applying external electric fields.

There are interesting prospects in implementing the functional zone as a multilayer structure containing several layers with various levels of activity, implemented, for example, out of organic, metalorganic and non-organic materials whose molecular and/or crystalline structure have instilled active elements based on them, which will change their state under electric field or light radiation influence, which allows to widen the range and quantity of electric resistance levels therefore increasing the memory data density.

The functional zone may be implemented as a multilayer structure with alternating active, passive and barrier layers, where the passive layers are being made of organic, metalorganic and non-organic materials which are donor and/or acceptor charge carriers and possess ion and/or electron conductivity, while the barrier layer is made of material with high electron conductivity and low ion conductivity, which allows to improve the memory cell stability over time at the same time increasing data density due to increasing the quantity of the stored values of the memory cell electric resistance.

The memory cell's electrode may be implemented in form of several separate elements, for example two or three elements placed above the functional layer, which permit more precise control the value of the cell electric resistance, therefore improving the quantity of information recording or the memory cell electric resistance analog values precision, as well as allows to decouple the information writing and reading electric circuits.

The memory cell electrode may be implemented in the form of two elements separated in a space by a semiconductor and/or organic light emitting material and forming, for example, either a diode structure, or a photo resistance or a photo sensor element, which allows decoupling the information writing and reading electric circuits electrically or optically.

The memory cell electrode may be implemented in the form of three parallel elements separated in space by a semiconductor and/or organic light emitting material and forming, for example, a light emitting structure and a photo resistance or a photo sensor element, which allows decoupling the information writing and reading electric circuits optically.

FIG. 1 is a cross sectional illustration of a memory cell 100, in accordance with an aspect of the present invention. The memory cell 100 can be formed on a wafer, and typically on a base substrate 102, such as silicon. The cell 100 includes a bottom electrode 104, a functional layer 103, and a top electrode 110. Unlike conventional inorganic memory cells that can maintain only two states, the memory cell 100 is capable of maintaining two or more states. Thus, a single cell of the memory cell 100 can hold one or more bits of information. Furthermore, the memory cell 100 is a non-volatile memory cell and consequently, does not require a constant or nearly constant power supply.

The bottom electrode 104 is formed by depositing a first conductive material over the substrate 102. Trenches and/or vias can be formed in the substrate prior to deposition of such conductive material followed by selectively depositing the first conductive material into the trenches. According to one aspect of the present invention, the electrodes 104, 110 can comprise; tungsten, silver, copper, titanium, chromium, germanium, gold, aluminum, magnesium, manganese, indium, iron, nickel, palladium, platinum, zinc, alloys thereof, indium-tin oxide, other conductive oxides, polysilicon, doped amorphous silicon, metal silicides, and various metal composition alloys. In addition, other conducting or semi-conducting polymers, PEDOT/PSS, polyaniline, polythiothene material, their derivatives and other doped or undoped conducting and semiconducting organic polymers, oligomers or monomers, conducting and semiconducting metal oxides and nitrides and silicides, conductive organic polymers, and the like, can be employed for fabrication of the electrodes 104 and 110. In addition, since some metals can have a layer of oxide formed thereupon that can adversely affect the performance of the memory cell, non-metal material such as amorphous carbon can also be employed for electrode formation. In addition, other conductive polymers and/or optically transparent oxide or sulfide material can be employed in forming the electrodes 104, and 110.

As illustrated in FIG. 1, sandwiched between the two electrodes 104, 110, is a functional zone 103. Such functional zone can itself comprise of organic, metal organic, and non-organic materials, in the form of an active layer 108 and a passive layer 106.

The passive layer 106 is operative to transport charge from the electrode 104 to the interface between the active layer 108 and the passive layer 106. Additionally, the passive layer 106 facilitates charge carrier (e.g., electrons or holes) and/or metal ion injection into the active layer 108 and increases the concentration of the charge carrier and/or metal ions in the active layer 108 resulting in a modification of the conductivity of the active layer 108. Furthermore, the passive layer 106 can also store opposite charges in the passive layer 106 in order to balance the total charge of the device 100. Both the passive layer 106 and the active layer 108 can comprise further sub layers, as shown in FIG. 1.

As further illustrated in FIG. 1, the passive layer 106 can be part of the functional layer 103, which is formed on the bottom electrode 104. The passive layer 106 contains at least one conductivity facilitating compound that has the ability to donate and accept charges (holes and/or electrons). Generally, the conductivity facilitating compound has at least two relatively stable oxidation-reduction states that can permit the conductivity facilitating compound to donate and accept charges. Passive layer 106 should also be capable of donating and accepting ions. Examples of other conductivity facilitating compounds that can be employed for the passive layer 106 include one or more of the following: tungsten oxide ($WO_3$), molybdenum oxide ($MoO_3$), titanium dioxide ($TiO_2$), and the like.

The passive layer 106 can in some instances act as a catalyst when forming the active layer 108. In this connection, a backbone of a conjugated organic molecule can initially form adjacent the passive layer 106, and grow or assemble away and substantially perpendicular to the passive layer surface. As a result, the backbones of the conjugated organic molecule can be self aligned in a direction that traverses the two electrodes. The passive layer can be formed by a deposition process (e.g. thermal deposition, PVD, non-selective CVD, and the like) or by a complete sulfidation of pre-deposited thin Cu layer.

Referring now to the active layer 108, such layer can include various organic, metal organic conjugate polymers. In addition, various light emitting material, such as; light emitting structure, photo resistance, or photo sensors can be part of the active layer 108. Moreover, additional material with donor/acceptor charges such as; molecules and/or ions with an electric dipole element, polymer ferroelectrics clusters, non-organic ferro-electrics, salts, alkalis and acids (organic or non organic), water molecules, materials with molecules that can dissociate in an electrical field and/or under radiation, organic salts and/or molecules with variable valency of metals, can also be employed as part of the active layer 108. As such, examples of organic, non-organic salts, alkalis, acids and molecules that can dissociate in an electric field and/or under light radiation can include the following anions: I, Br, Cl, F, $ClO_4$, $AlCl_4$, $PF_6$, $AsF_6$, $AsF_4$, $SO_3CF_3$, $BF_4$, $BCl_4$, $NO_3$, $POF_4$, CN, $SiF_3$, $SiF_6$, $SO_4$, $CH_3CO_2$, $C_6H_5CO_2$, $CH_3C_6H_4SO_3$, $CF_3SO_3$, $N(SO_3CF_3)_2$, $N(CF_3SO_2)(C_4F_9SO_2)$, $N(C_4F_9SO_2)_2$, alkylphosphate, organoborate, bis-(4-nitrophenil) sulfonilimide, poly(styrene sulfonate)(polyanions)— and for cations such as: Li, Na, K, Rb, Cs, Ag, Ca, Mg, Zn, Fe, Cu, H, $NH_4$ and the like. Similarly, examples of clusters employed in the active layer 108 that are based on polymer ferro electrics and non-organic ferro-electrics can include poly(vinylidene fluoride), poly(vinylidene fluoride)/trifluoroethylene, and the like.

In a related aspect of the present invention, various porous dielectric materials can also be employed as part of the functional layer 103. Such porous material for example, can include matter selected from the group of Si, amorphous Si, silicon dioxide ($SiO_2$), aluminum oxide ($Al_2O_3$), copper oxide ($Cu_2O$), titanium dioxide ($TiO_2$), boron nitride (BN), vanadium oxide ($V_2O_3$), carbon tri-nitride ($CN_3$), and ferroelectric materials, including barium-strontium titanate ((Ba, Sr) $TiO_3$).

In accordance with another aspect of the present invention, the active layer 108 of the memory cell 100 can include polymers with variable electric conductivity. Such polymers with variable electrical conductivity can include; polydiphenylacetylene, poly(t-butyl)diphenylacetylene, poly(trifluoromethyl)diphenylacetylene, polybis-trifluoromethyl)acetylene, polybis(t-butyldiphenyl)acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitro-phenylacetylene, poly(trifluoromethyl)phenylacetylene, poly(trimethylsilyl)pheylacetylene, polydipyrrylmethane, polyindoqiunone, polydihydroxyindole, polytrihydroxyindole, furane-polydihydroxyindole, polyindoqiunone-2-carboxyl, polyindoqiunone monohydrate, polybenzobisthiazole, poly(p-phenylene sulfide) and derivatives with active molecular group.

As used in this application, an active molecule or molecular group can be one that changes a property when subjected to an electrical field or light radiation, (e.g. iozinable group); such as: nitro group, amino group, cyclopentadienyl, dithiolane, metilcyclopentadienyl, fulvalenediyl, indenyl, fluorenyl, cyclobis(paraquart-p-phenylene), bipyridinium, phenothiazine, diazapyrenium, benzonitrile, benzonate, benzamide, carbazole, dibenzothiophene, nitrobenzene, aminobenzenesulfonate, amonobenzanate, and molecular units with redox-active metals; metallocenes (Fe, V, Cr, Co, Ni and the like) complex, polypyridine metal complex (Ru, Os and the like).

In another aspect of the present invention, the active layer 108 can include polymers such as polyaniline, polythiophene, polypyrrole, polysilane, polystyrene, polyfuran, polyindole, polyazulene, polyphenylene, polypyridine, polybipyridine, polyphthalocyanine, polysexithiofene, poly (siliconoxohemiporphyrazine), poly(germaniumoxohemiporphyrazine), poly(ethylenedioxythiophene) and related derivatives with active molecular group. It is to be appreciated that other suitable and related chemical compounds can also be employed including: aromatic hydrocarbons; organic molecules with donor and acceptor properties (N-Ethylcarbazole, tetrathiotetracene, tetrathiofulvalene, tetracyanoquinodimethane, tetracyanoethylene, cloranol, dinitro-n phenyl and so on); metallo-organic complexes (bisdiphenylglyoxime, bisorthophenylenediimine, tetraazatetramethylannulene and so on); porphyrin, phthalocyanine, hexadecafluoro phthalocyanine and their derivatives with active molecular group.

In general, the memory cell structure 100 employing the material discussed supra can exhibit a formation of high conductivity areas, or affect a resistance of the functional zone 103 in response to an external stimulus such as an electric voltage, electric current, light radiation, and the like. For example, presence of ferro-electric material can increase an internal electric field intensity, and as a result application of a lower external electric voltage can be required for a writing of the memory cell 100. As explained supra, the active layer 108 can be created on the passive layer 106 and results in an interface between the two layers. Moreover, the active layer 108 can be formed via a number of suitable techniques. One such technique involves growing the active layer 108 in the form of an organic layer from the passive layer 106. Another technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometime it may have a chemical bond formed between the conjugated organic polymer of the active layer 108 and the passive layer 106.

In one aspect of the present invention, the active layer 108 can also be comprised of a conjugated organic material, such as a small organic molecule and a conjugated polymer. If the organic layer is polymer, a polymer backbone of the conjugated organic polymer may extend lengthwise between the electrodes 104 and 110 (e.g., generally substantially perpendicular to the inner, facing surfaces of the electrodes 104 and 110). The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials contributes to the controllably conductive properties of the selectively conductive media.

In this connection, the conjugated organic material of the active layer 108 has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material employed as part of the active layer 108 according to one aspect of the present invention can be cyclic or acyclic. For some cases, such as organic polymers, the organic material can self assemble on bottom electrode during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Additionally, the properties of the organic material can be modified by doping with a suitable dopant.

The top electrode 110 is formed on/over the organic material of the active layer 108 and/or the passive layer 106. The top electrode 110 can be comprised of similar material as described supra for the lower electrode 104. Additionally, alloys with phosphorous, nitrogen, carbon, and boron, graphite, conductive oxides and other conductive substances can also be employed.

The thickness of the bottom electrode 104 and the top electrode 110 can vary depending on the implementation and the memory cell being constructed. However, some exemplary thickness ranges include about 0.01 µm or more and about 10 µm or less, about 0.05 µm or more and about 5 µm or less, and/or about 0.1 µm or more and about 1 µm or less.

The active layer 108 and the passive layer 106 can be collectively referred to as a selectively conductive media or a selectively conductive layer, which is a part of the functional zone 103. The conductive properties of this media (e.g., conductive, non-conductive, semi-conductive) can be modified in a controlled manner by applying various voltages across the media via the electrodes 104 and 110.

The organic layer that in one exemplary aspect can form the active layer 108, has a suitable thickness that depends upon the chosen implementations and/or the memory cell being fabricated. Some suitable exemplary ranges of thickness for the organic polymer layer, which in part can form the active layer 108, are about 0.001 µm or more and about 5 µm or less, about 0.01 µm or more and about 2.5 µm or less, and about a thickness of about 0.05 µm or more and about 1 µm or less. Similarly, the passive layer 106 has a suitable thickness that can vary based on the implementation and/or memory cell being fabricated. Some examples of suitable thicknesses for the passive layer 106 are as follows: a thickness of about 2 Å or more and about 0.1 µm or less, a thickness of about 10 Å or more and about 0.01 µm or less, and a thickness of about 50 Å or more and about 0.005 µm or less.

In order to facilitate operation of the memory cell 100, the active layer 108 is generally thicker than the passive layer 106. In one aspect, the thickness of the active layer is from about 0.1 to about 500 times greater than the thickness of the passive layer. It is appreciated that other suitable ratios can be employed in accordance with the present invention. It is to be appreciated that the various layers employed in fabricating the memory cell can themselves comprise a plurality of sub layers, as depicted in FIG. 1 wherein passive layer 106, and active layer 108, are each shown as comprising three sub-layers.

The memory cell 100, like conventional memory cells, can have two states, a conductive (low impedance or "on") state or non-conductive (high impedance or "off") state. However, unlike conventional memory cells, the memory cell 100 is able to have/maintain a plurality of states, in contrast to a conventional memory cell that is limited to two states (e.g., off or on). The memory cell can employ varying degrees of conductivity to identify additional states. For example, the memory cell 100 can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information, and the like.)

Switching the memory cell 100 to a particular state is referred to as programming or writing. Programming is accomplished by applying a particular voltage (e.g., 9 volts, 2 volts, 1 volt, . . . ) across the selectively conductive media via the electrodes 104 and 110. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the memory cell 100, the thickness of the various layers, and the like. Generally speaking, the presence of an external stimuli such as an applied electric field that exceeds a threshold value ("on" state) permits an applied voltage to write, read, or erase information into/from the memory cell 100; whereas the absence of the external stimuli that exceeds a threshold value ("off" state) prevents an applied voltage to write or erase information into/from the memory cell 100.

To read information from the memory device, a voltage or electric field (e.g., 2 volts, 1 volt, 0.5 volts) is applied via a voltage source. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

Figure 2:
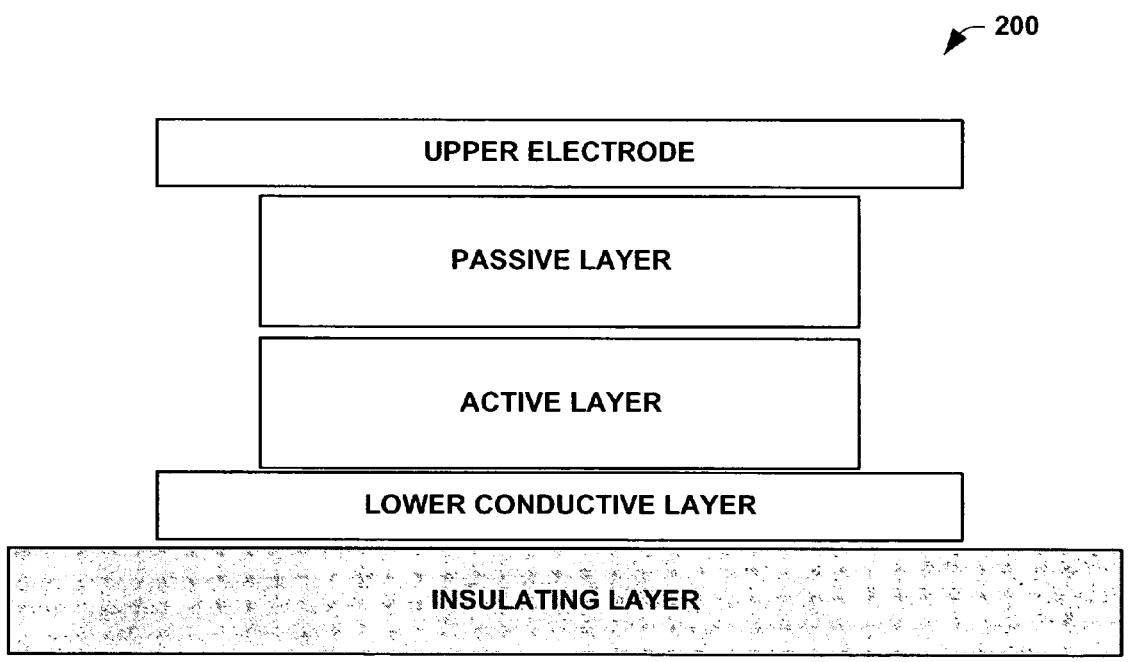
FIG. 2 is another schematic diagram of the organic memory cell with various active layers and sub layers.

FIG. 2 illustrates another exemplary structure for a memory cell 200 in accordance with the present invention. A first or lower conductive layer is deposited on an upper surface of an insulating layer. The lower conductive layer can comprise aluminum, titanium, tungsten, platinum, palladium and their alloys and nitrides, conductive oxides and amorphous carbon (a-C). Such first or lower conductor layer can be about 1000 Å–5000 Å thick. Upon this lower conductive and active layer is deposited. Such active layer can comprise; polymer polyphenilacetylene+molecules of chloranil or tetracyano-quino-dimethane or dichlordicyanoquinone, (which can be deposited from solution by spin-coating); copper phthalocyanine (which can be deposited by thermal deposition method to about 30 Å–1000 Å); copper hexadecafluoro phthalocyanine, amorphous carbon or palladium, (which can be deposited on the upper surface of the active layer by magnetron co-sputtering); porous silicon oxide ($SiO_2$) and polisilanes with N-carbazolylpropyl group; polymer polytiophene with cyclopentadienyl groups, (which can be deposited from solution by spin-coating; polisilanes with N-carbazolylpropyl group); polisilanes with cyclopentadienyl groups; polisilanes with amino groups; polytiophene with alkyl amino groups; polytiophene with cyclopentadienyl alkyl groups; composite containing polydiphenilacetylene containing carbazolyl groups and dinitro-n-phenyl (DNP); polyethylenedioxythiophene and Li $CF_3SO_3$ salt containing porous ferroelectric (polyvinyline fluoride), polydiphenilacetylene containing carbazolyl groups dinitro-n-phenyl (DNP); polyethylenedioxythiophene and salt of potassium hexycyanoferrate.

Figure 3:
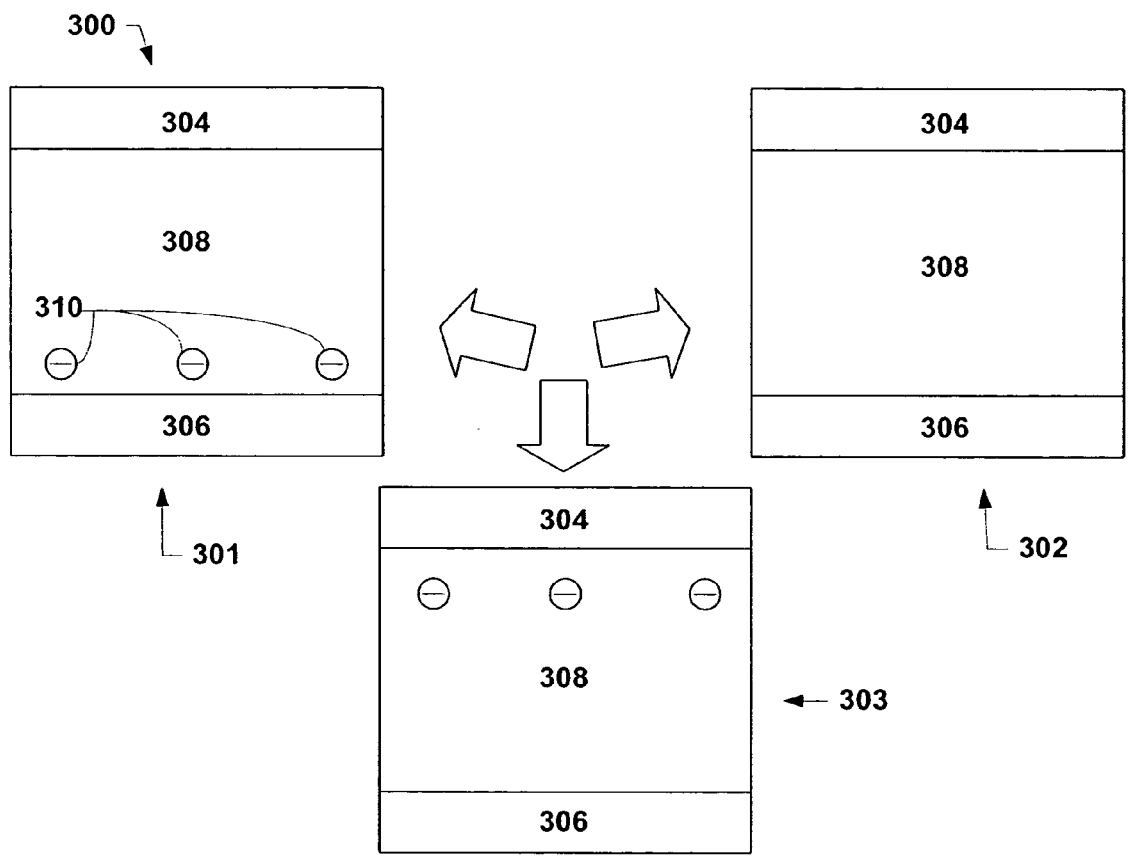
FIG. 3 is a schematic diagram depicting an organic memory device in various impedance states in accordance with an aspect of the present invention.

FIG. 3 is a schematic diagram that illustrates an organic memory device 300 in various states in accordance with an aspect of the present invention. The device 300 is depicted in a first "off" state 301, an "on" state 302, and a second "off" state 303. It is appreciated that memory devices formed in accordance with the present invention can have other states than those depicted in FIG. 3. The organic memory device 300 comprises a top electrode 304, a bottom electrode 306 and a selectively conductive layer 308 and at least one passive layer. In addition, various barrier layers, for example comprised of material such as $Li_3N$, can be placed at various locations among the active layer, passive layer and electrodes. In the first off state 301, electrons 310 collect in the selectively conductive layer 308 near the bottom electrode 306. In the on state 302, the electrons 310 are uniformly distributed thereby indicating an on state. In the second off state 303, the electrons collect in the selectively conductive layer 308 near the top electrode 304.

Figure 4:
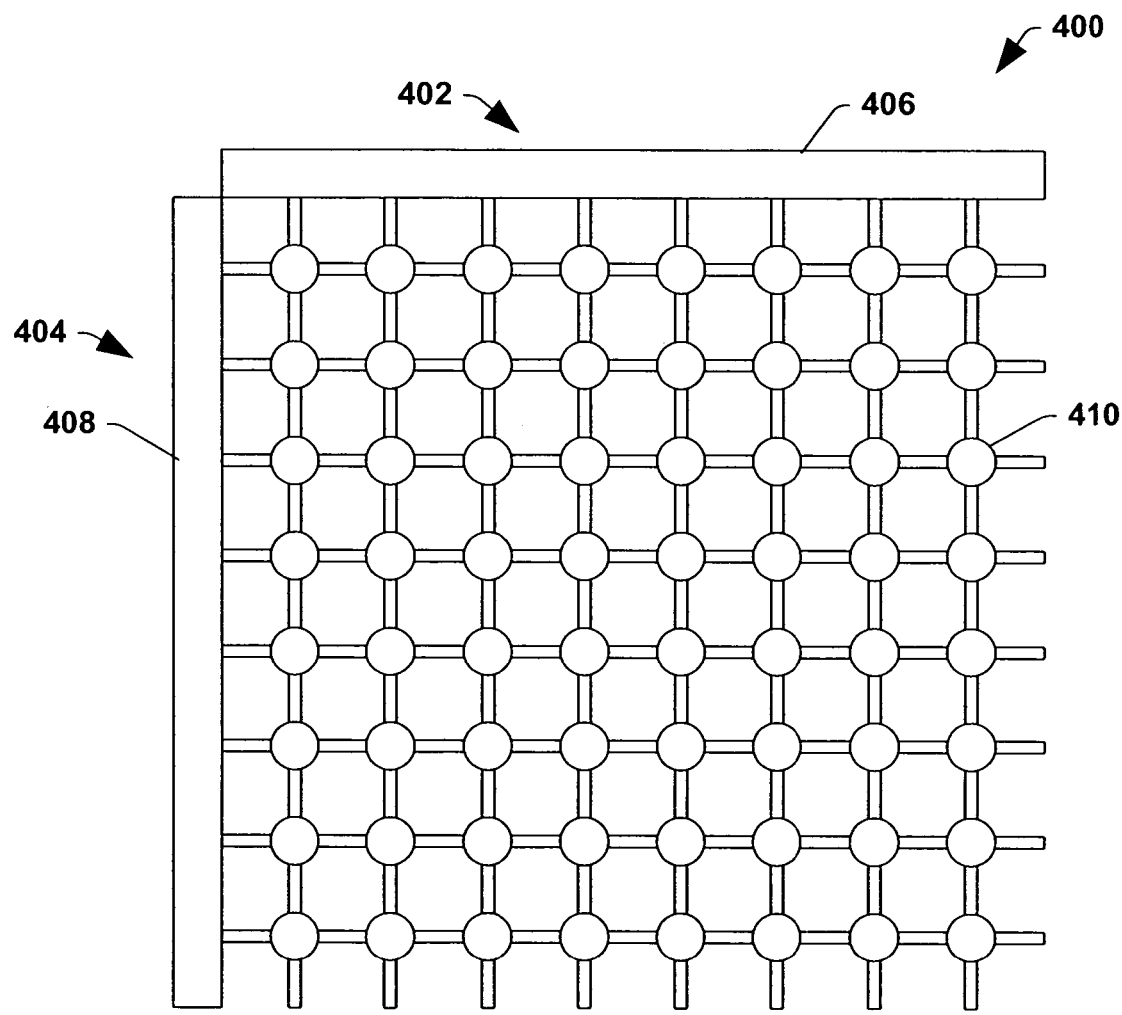
FIG. 4 is a schematic block diagram illustrating multiple memory layer and memory cell storage and access in accordance with an aspect of the present invention.

Turning to FIG. 4, an array 400 of memory cells in accordance with an aspect of the present invention is illustrated. Such an array is generally formed on a silicon based wafer, and includes a plurality of columns 402, referred to as bitlines, and a plurality of rows 404, referred to as wordlines. Such bit line and wordlines can be connected to the top and bottom metal layers of the memory component. The intersection of a bitline and a wordline constitutes the address of a particular memory cell. Data can be stored in the memory cells (e.g., as a 0 or a 1) by choosing and sending signals to appropriate columns and rows in the array (e.g., via a column address strobe (CAS) 406 and a row address strobe (RAS) 408, respectively). For example, the state (e.g., a 0 or a 1) of the memory cell indicated at 410 is a function of the $3^{rd}$ row and $8^{th}$ column of the array 400. In dynamic random access memory (DRAM), for example, memory cells include transistor-capacitor pairs. To write to a memory cell, a charge can be sent to the appropriate column (e.g., via CAS 406) to activate the respective transistors in the columns, and the state that respective capacitors should take on can be sent to the appropriate columns (e.g., via RAS 408). To read the state of the cells, a sense-amplifier can determine the level of charge on the capacitors. If it is more than 50 percent, it can be read as a 1; otherwise it can be read as a 0. It is to be appreciated that while the array 400 illustrated in FIG. 4 includes 64 memory cells (e.g., 8 rows×8 columns), the present invention has application to any number of memory cells and is not to be limited to any particular configuration, arrangement and/or number of memory cells.

Figure 5:
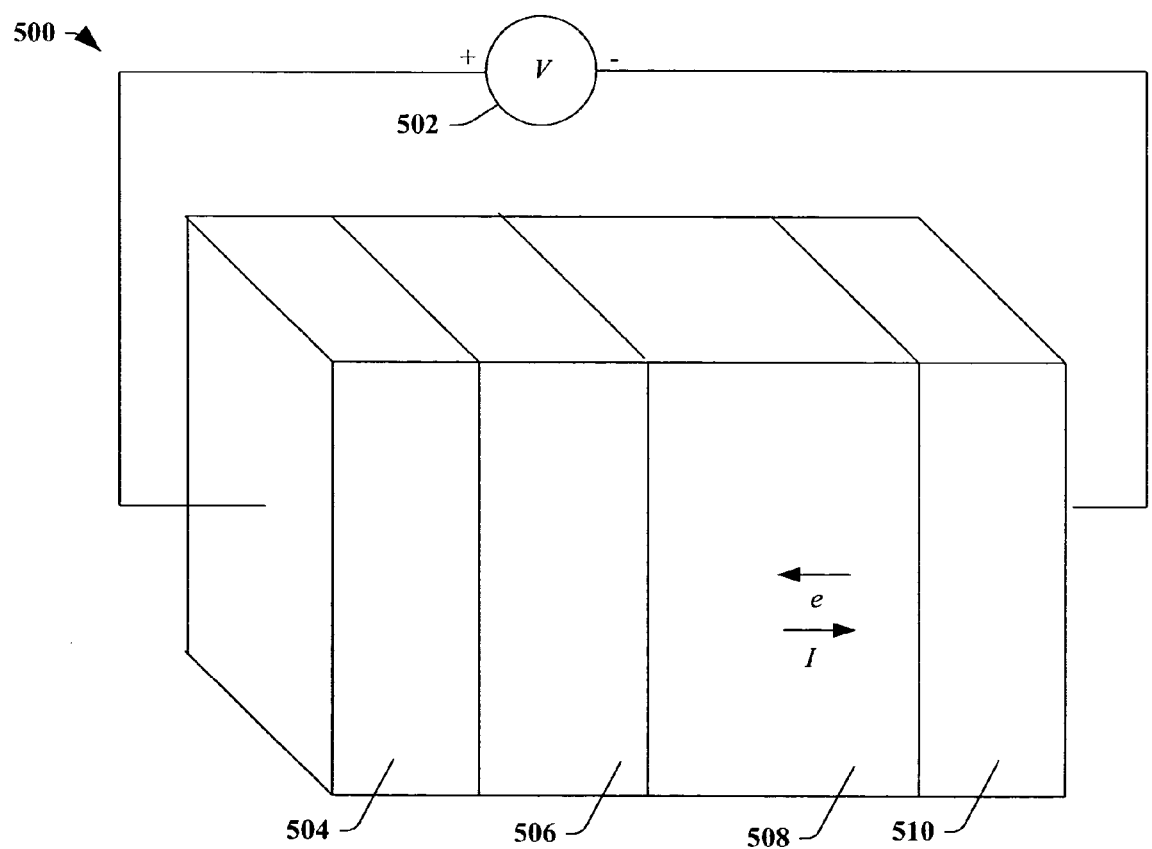
FIG. 5 is a perspective diagram of a memory device in accordance with an aspect of the present invention.

Now referring to FIG. 5, a perspective diagram of an organic memory device in accordance with an aspect of the present invention is depicted. The memory device includes a first electrode 504, a passive layer 506, an organic polymer layer 508, and a second electrode 510. The diagram also illustrates a voltage source 502 connected to the first electrode 504 and the second electrode 510 that can apply an external stimulus in form of a voltage on the first electrode 504 and the second electrode 510.

The first electrode 504 and the second electrode 510 are comprised of a conductive material, such as, aluminum, chromium, germanium, carbon, hafnium, indium, rhenium, ruthenium, tungsten, gold, magnesium, manganese, indium, iron, nickel, palladium, platinum, silver, titanium, zinc, alloys thereof, indium-tin oxide, polysilicon, doped amorphous silicon, metal carbides, nitrides and silicides, conducting oxides, semiconducting oxides, polysilicon, doped amorphous silicon, metal silicides, metal nitrides and silicides and the like. Exemplary alloys that can be utilized for the conductive material include Hastelloy®, Kovar®, Invar, Monel®, Inconel®, stainless steel, magnesium-silver alloy, and various other alloys.

As explained supra, the presence of an external stimuli; such as an applied electric field that exceeds a threshold value ("on" state), permits an applied voltage 502 to write, read, or erase information into/from the organic memory cell; whereas the absence of the external stimuli that exceeds a threshold value ("off" state) prevents an applied voltage to write or erase information into/from the organic memory cell.

FIG. 6 is a schematic diagram that depicts a passive layer 600 in accordance with an aspect of the present invention. A first layer 606 is formed that forms the lower electrode. A second layer 604 is formed on the first layer. The second layer comprises $Cu_xS$ and has a thickness of about 20 Å or more. A third layer 602 is formed on the second layer 604. The third layer 602 contains $Cu_2O$, and/or CuO and generally has a thickness of about 10 Å or less. It is appreciated that alternate aspects of the invention can employ suitable variations in composition and thickness and still be in accordance with the present invention.

FIG. 7 is a schematic diagram illustrating an organic layer 700 formed by a chemical vapor deposition (CVD) process as part of the active layer in accordance with an aspect of the present invention. The organic layer 700 is formed via a gas phase reaction process. Typically, the organic layer 700 is formed in contact with a passive layer and an electrode. The organic layer 700 is comprised of polymer polydiphenylacetylene (pDPA). This polymer layer, as shown can be fabricated to be about 750 Å thick.

Turning now to FIG. 8, a diagram depicting another organic layer 800 formed from a CVD process in accordance with an aspect of the present invention is illustrated. Once again, the organic layer 800 is formed via a gas phase reaction process. The organic layer 800 is formed in contact with a passive layer and an electrode. The organic polymer layer 800 is comprised of polymer polyphenylacetylene (PPA).

Referring to FIG. 9, a block diagram of another organic layer 900 as part of the active layer of a memory cell formed by spin coating in accordance with an aspect of the present invention is illustrated. The organic layer 900 is formed via a spin coating process, instead of a gas phase reaction process. The organic layer 900 is formed in contact with a passive layer and an electrode. The organic layer 900 is comprised substantially of PPA and has a thickness of about 1000 Å.

Experimental results tend to show that organic layers formed via spin coating yield a more reliable polymer layer than polymer layers formed via CVD. This may be due to the presence of oxygen and lack of control of heat generated by polymerization under CVD. It is appreciated that controlling heat and oxygen during polymerization for CVD processes can improve the resulting polymer layer.

It is appreciated that various alternatives to and variations of the layers described in FIGS. 6–9 can be employed in accordance with the present invention. Moreover, it is to be appreciated that other methods of forming the active layer can be employed such as liquid phase reaction process, e.g. self assembling of an active layer(s) on bottom electrode (or a passive layer) via application of a suitable chemical compound.

Figure 10:
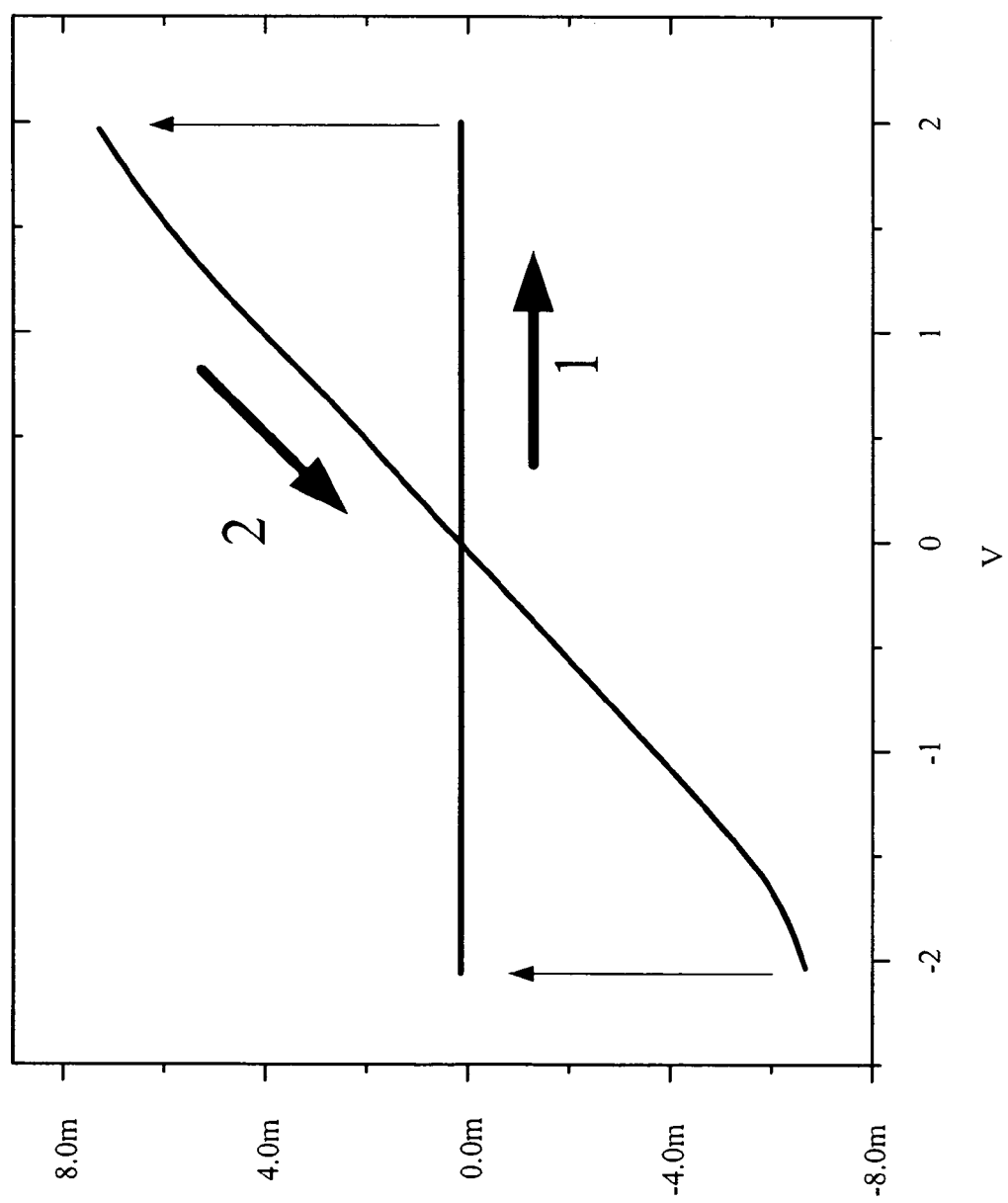
FIG. 10 is a graph illustrating I–V characteristics for a memory device in accordance with an aspect of the present invention.

FIG. 10 is a graph 1000 that illustrates an I–V graph for a memory device in accordance with an aspect of the present invention. It can be seen that from state 1, which indicates "off", the device can be modified to be in state 2, which indicates "on", by applying a positive voltage. Additionally, it can be seen that whilst in state 1, the organic memory device has a high impedance and low conductance. Subsequently, the device can be modified to change from state 2 to state 1 by application of a negative voltage, therein causing a reverse current until the state 1 is obtained.

Figure 11:
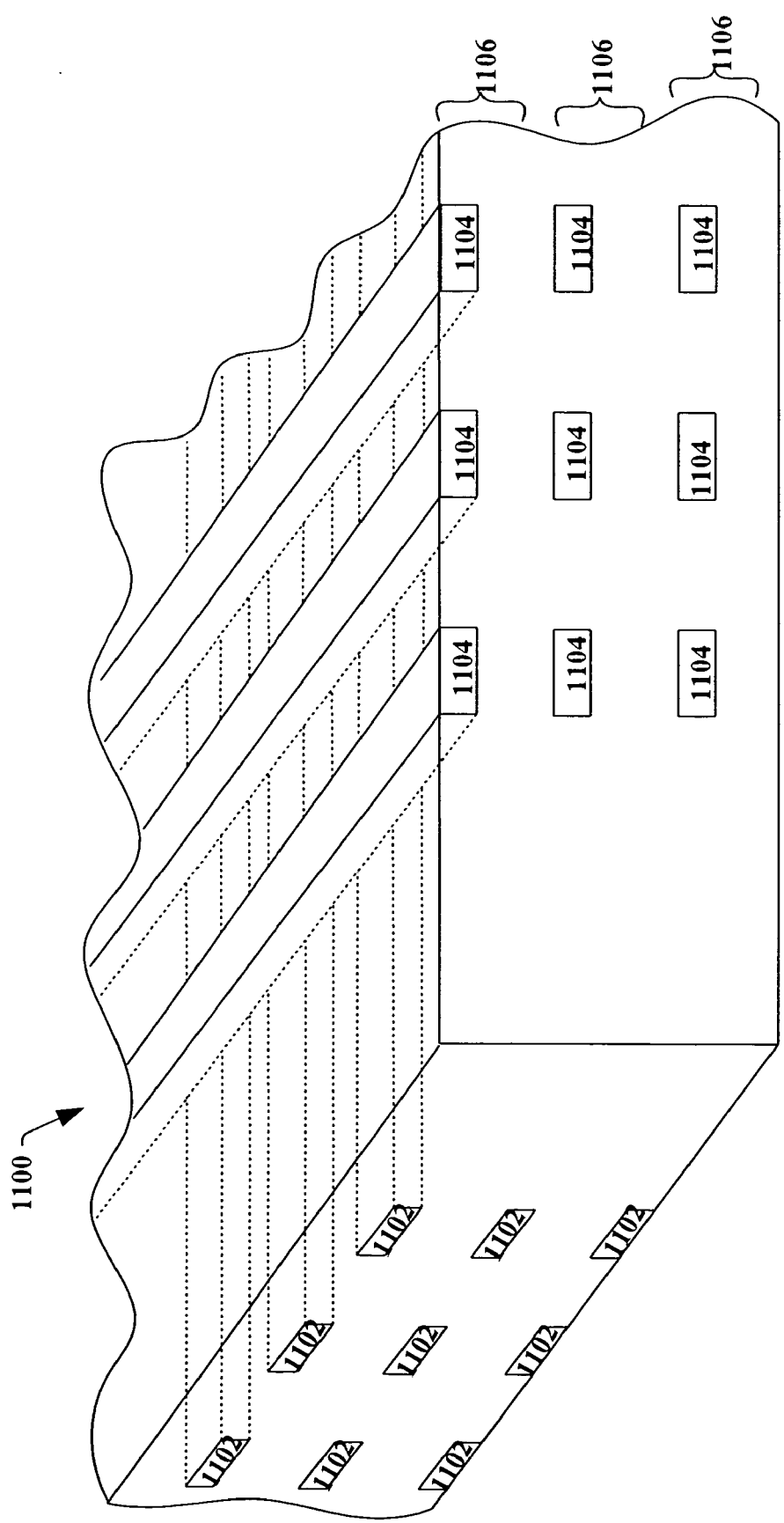
FIG. 11 is a three dimensional view of a memory device having a functional layer in accordance with an aspect of the present invention.

Referring to FIG. 11, a three dimensional view of a memory device 1100 containing a plurality of memory cells with functional zones in accordance with an aspect of the invention is shown. The memory device 1100 contains a plurality of first electrodes 1102, a plurality of second electrodes 1104, and a plurality of memory cell layers 1106. Between the respective first and second electrodes are the controllably conductive media (not shown). The plurality of first electrodes 1102 and the plurality of second electrodes 1104 are shown in substantially perpendicular orientation, although other orientations are possible. The three dimensional microelectronic memory device is capable of containing an extremely high number of memory cells thereby improving device density. Peripheral circuitry and devices are not shown for brevity.

The memory cells/devices are useful in any device requiring memory. For example, the memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the memory devices. Examples of hand-held devices include cell phones and other two way communication devices, personal data assistants, palm pilots, pagers, notebook computers, remote controls, recorders (video and audio), radios, small televisions and web viewers, cameras, and the like.

Figure 12:
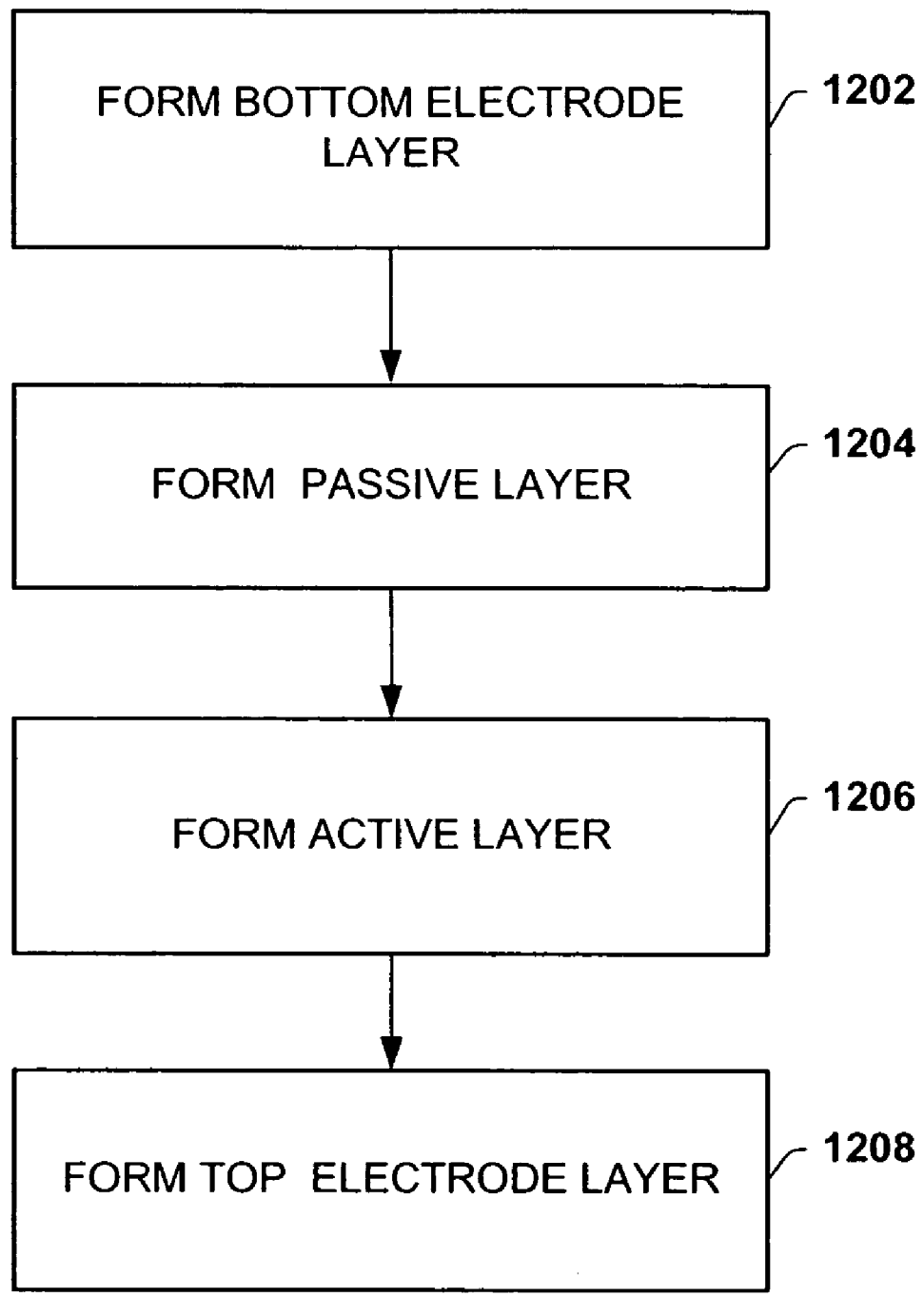
FIG. 12 illustrates a flow chart for a methodology according to the present invention.

FIG. 12 illustrates a methodology according to one aspect of the present invention.

While the exemplary method is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated herein, in accordance with the invention. In addition, not all illustrated blocks, events or acts, may be required to implement a methodology in accordance with the present invention. Moreover, it will be appreciated that the exemplary method and other methods according to the invention may be implemented in association with a deposition and etch process for IC fabrication, and/or a damascene fill and polish procedure as well as in association with other systems and apparatus not illustrated or described.

Initially, at 1202 a bottom metal layer is being deposited, e.g., as part of an interconnect line as described in detail supra. Next at 1204 a passive layer, as discussed in detail supra, is formed over the bottom metal layer. At 1206, and over the passive layer, an active layer is being deposited. Next and at 1208, a top metal layer is being formed over the active layer, e.g., as part of an interconnect line. In addition, layers of the memory component can be associated with and/or part of a memory cell or array, as described in more detail supra.

The following examples illustrate various particular aspects of the present invention. Unless otherwise indicated in the following examples and elsewhere in the specification and claims, all parts and percentages are by weight, all temperatures are in degrees Centigrade, and pressure is at or near atmospheric pressure.

EXAMPLE 1

Ti/polyphenylacetylene+molecules of chloraniline or tetracyano-quino-dimethane/amorphous carbon (a-C). A first or lower conductive conductor is deposited on an upper surface of an insulating layer. The first or lower conductor may be formed from materials selected from: aluminum, titanium, tungsten, platinum, palladium and their alloys and nitrides, conductive oxides and amorphous carbon (a-C). The first or lower conductor layer is about 3000 Å thick. The active layer is mixture of a polymer polyphenylacetylene+ molecules of chloraniline or tetracyano-quino-dimethane or dichlordicyanoquinone, which may be deposited from solution by spin-coating. The active layer is about 500 Å thick. The second conductor layer is amorphous carbon or palladium, which can be deposited on the upper surface of the active layer by magnetron co-sputtering. The second conductor layer is about 2000 Å thick.

EXAMPLE 2

Ti/copper phthalocyanine/cupper hexadecafluoro phthalocyanine/a-C or Pd or ITO. A first or lower conductive conductor is deposited on an upper surface of an insulating layer. The first or lower conductor may be formed from titanium and is about 3000 Å thick. The lower active layer is copper phthalocyanine which can be deposited by thermal deposition method and is about 50 Å thick. The upper active layer is copper hexadecafluoro phthalocyanine which can be deposited by thermal deposition method and is about 50 Å thick. The second conductor layer is amorphous carbon, which can be deposited on the upper surface of the second polyaniline active layer by magnetron co-sputtering. The second conductor layer is about 2000 Å thick.

EXAMPLE 3

Ti/polysilanes with N-carbazolylpropyl group+silicon oxide ($SiO_2$)/a-C or Pd or ITO. This cell is fabricated in a similar manner as Example 1, except that the active layer is a composite of containing porous silicon oxide ($SiO_2$) and polysilanes with N-carbazolylpropyl group.

EXAMPLE 4

Ti/Polythiophene with cyclopentadienyl groups/amorphous carbon (a-C). A first or lower conductive conductor is deposited on an upper surface of an insulating layer. The first or lower conductor may be formed from materials selected from: aluminum, titanium, tungsten, platinum, palladium and their alloys and nitrides, conductive oxides, and amorphous carbon (a-C). The first or lower conductor layer is about 3000 Å thick. The active layer is mixture of a polymer polythiophene with cyclopentadienyl groups, which may be deposited from solution by spin-coating. The active layer is about 500 Å thick. The second conductor layer is amorphous carbon or palladium, which can be deposited on the upper surface of the active layer by magnetron co-sputtering. The second conductor layer is about 2000 Å thick.

EXAMPLE 5

Ti/polysilanes with N-carbazolylpropyl group/a-C or Pd or ITO. This cell is fabricated in a similar manner as Example 4, except that the active layer is polysilanes with N-carbazolylpropyl group.

EXAMPLE 6

Pd/polysilanes containing cyclopentadienyl groups/a-C or Pd or ITO. This cell is fabricated in a similar manner as Example 4, except that the active layer is polysilanes with cyclopentadienyl groups.

EXAMPLE 7

Pd/polysilanes with amino groups/a-C or Pd or ITO. This cell is fabricated in a similar manner as Example 4, except that the active layer is polysilanes with amino groups.

EXAMPLE 8

Ti/Polythiophene with amino groups/a-C or Pd or ITO. This cell is fabricated in a similar manner as Example 4, except that the active layer is polythiophene with amino groups.

EXAMPLE 9

Ti/Polythiophene with alkyl amino groups/a-C or Pd or ITO. This cell is fabricated in a similar manner as Example 4, except that the active layer is polythiophene with alkyl amino groups.

EXAMPLE 10

Ti/Polythiophene with cyclopentadienyl alkyl groups/a-C or Pd or ITO. This cell is fabricated in a similar manner as Example 4, except that the active layer is polythiophene with cyclopentadienyl alkyl groups.

EXAMPLE 11

Ti/Polythiophene with cyclopentadienyl groups/a-C or Pd or ITO. This cell is fabricated in a similar manner as Example 4, except that the active layer is polythiophene with cyclopentadienyl alkyl groups.

EXAMPLE 12

Ti/Polydiphenilacetylene with carbazolyl groups+dinitro-n-phenyl (DNP)/a-C. This cell was fabricated in a similar manner as Example 4, except that the active layer is a composite containing polydiphenilacetylene containing carbazolyl groups and dinitro-n-phenyl(DNP).

EXAMPLE 13

Ti/polyethylenedioxythiophene+Li $CF_3SO_3$/Pd. This cell is fabricated in a similar manner as Example 4, except that the active layer is a composite of containing polyethylenedioxythiophene and $LiCF_3SO_3$ salt.

EXAMPLE 14

Ti/polydiphenylacetylene containing carbazolyl groups+dinitro-n-phenyl (DNP)+porous ferroelectric (polyvinyline fluoride)/a-C. This cell is fabricated in a similar manner as Example 4, except that the active layer is a composite of containing porous ferroelectric (polyvinyline fluoride), polydiphenylacetylene containing carbazolyl groups and dinitro-n-phenyl(DNP).

EXAMPLE 15

Ti/polyethylenedioxythiophene+salt of potassium hexycyanoferrate/Pd. This cell is fabricated in a similar manner as Example 4, except that the active layer is a composite of containing polyethylenedioxythiophene and salt of potassium hexycyanoferrate.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A memory device comprising:
    a first electrode;
    a functional media formed over the first electrode, the functional media stores information based on a change of an impedance state, the impedance state of the functional media chances based on a migration of electrons or holes when subject to an external electric field or light radiation, the impedance state indicative of information content, the functional media comprising 1) an active layer having an ability to donate and accept charges and 2) a passive layer comprising a conductivity facilitating compound having at least two stable oxidation-reduction states and an ability to donate and accept charges, the active layer having a thickness that is about 0.1 to about 500 times greater than a thickness of the passive layer; and a second electrode formed over the functional media.

2. The memory device of claim 1, wherein the active layer comprises organic material selected from the group comprising of polyacetylene, polyphenylacetylene, and polydiphenylacetylene.

3. The memory device of claim 1, wherein the first electrode or the second electrode comprises at least one selected from the group of tungsten, silver, copper, titanium, chromium, germanium, gold, aluminum, magnesium, manganese, indium, iron, nickel, palladium, platinum, zinc, alloys thereof, indium-tin oxide, conductive oxides, polysilicon, doped amorphous silicon, metal silicides, and various copper composition alloys.

4. The memory device of claim 1, wherein the first electrode or the second electrode comprise at least one selected from the group of conducting polymers, semiconducting polymers, PEDOT/PSS, polyaniline, polythiothene material, doped conducting organic polymers, doped semiconducting organic polymers, undoped conducting organic polymers, undoped semiconducting organic polymers, oligomers, monomers, conducting metal oxides, conducting metal nitrides, conducting metal silicides, semiconducting metal oxides, semiconducting metal nitrides, semiconducting metal silicides, and conductive organic polymers.

5. The memory device of claim 1, wherein the first electrode or the second electrode comprise amorphous carbon.

6. The memory device of claim 1, wherein the first electrode or the second electrode comprise at least one of optically transparent oxide and sulfide material.

7. The memory device of claim 1, wherein the active layer comprises at least one of an organic, metal organic, and non organic material.

8. The memory device of claim 1, wherein the active layer comprises at least one selected from the group of polydiphenylacetylene, poly(t-butyl)diphenylacetylene, poly(trifluoromethyl)diphenylacetylene, polybis-trifluoromethyl)acetylene, polybis(t-butyldiphenyl)acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitro-phenylacetylene, poly(trifluoromethyl) phenylacetylene, poly(trimethylsilyl) pheylacetylene, polydipyrrylmethane, polyindoqiunone, polydihydroxyindole, polytrihydroxyindole, furane-polydihydroxyindole, polyindoqiunone-2-carboxyl, polyindoqiunone monohydrate, polybenzobisthiazole, and poly(p-phenylene sulfide).

9. The memory device of claim 1, wherein the active layer comprises at least one of: materials of a nitro group, materials of an amino group, cyclopentadienyl, dithiolane, metilcyclopentadienyl, fulvalenediyl, indenyl, fluorenyl, cyclobis (paraquart-p-phenylene), bipyridinium, phenothiazine, diazapyrenium, benzonitrile, benzonate, benzamide, carbazole, dibenzothiophene, nitrobenzene, aminobenzenesulfonate, and amonobenzanate.

10. The memory device of claim 1, wherein the active layer comprises molecular units with redox-active metals.

11. The memory device of claim 10, wherein the redox active metals comprise at least one of metallocenes complex and polypyridine metal complex.

12. The memory device of claim 1, wherein the active layer comprises at least one selected from the group of polyaniline, polythiophene, polypyrrole, polysilane, polystyrene, polyfuran, polyindole, polyazulene, polyphenylene, polypyridine, polybipyridine, polyphthalocyanine, polysexithiofene, poly(siliconoxohemiporphyrazine), poly(germaniumoxohemiporphyrazine), and poly(ethylenedioxythiophene).

13. The memory device of claim 1, wherein active layer comprises at least one selected from the group of aromatic hydrocarbons; organic molecules with donor and acceptor properties, metallo-organic complexes; porphyrin, phthalocyanine, and hexadecafluoro phthalocyanine.

14. The memory device of claim 13, wherein the organic molecules with donor acceptor properties comprises at least one selected from the group of N-Ethylcarbazole, tetrathiotetracene, tetrathiofulvalene, tetracyanoquinodimethane, tetracyanoethylene, cloranol, and dinitro-n phenyl.

15. The memory device of claim 13, wherein the metallo-organic complexes are selected from the group of bisdiphenylglyoxime, bisorthophenylenediimine, and tetraaza-tetramethylannulene.

16. The memory device of claim 1, wherein the active layer comprises organic material selected from the group comprising of polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polystiroles.

17. The memory device of claim 1, wherein the active layer comprises material selected from the group comprising of electric dipole elements, polymer ferroelectrics clusters, non-organic ferro-electrics, salts, alkalis, acids, and water molecules.

18. The memory device of claim 1, wherein the active layer comprises material that can dissociate in at least one of an electrical field and under light radiation.

19. The memory device of claim 18, wherein the material that can dissociate on anions that are selected from the group consisting of I, Br, Cl, F, $ClO_4$, $AlCl_4$, $PF_6$, $AsF_6$, $AsF_4$, $SO_3CF_3$, $BF_4$, $BCl_4$, $NO_3$, $POF_4$, CN, $SiF_3$, $SiF_6$, $SO_4$, $CH_3CO_2$, $C_6H_5CO_2$, $CH_3C_6H_4SO_3$, $CF_3SO_3$, $N(SO_3CF_3)_2$, $N(CF_3SO_2)(C_4F_9SO_2)$, $N(C_4F_9SO_2)_2$, alkylphosphate, organoborate, bis-(4-nitrophenil) sulfonilimide, and poly(styrene sulfonate)(polyanions).

20. The memory device of claim 18, wherein the material that can dissociate on cations that are selected from the group consisting of Li, Na, K, Rb, Cs, Ag, Ca, Mg, Zn, Fe, Cu, H, and $NH_4$.

21. The memory device of claim 1, wherein the functional media comprises porous dielectric material.

22. The memory device of claim 21, wherein the porous dielectric material is selected from the group consisting of Si, amorphous Si, silicon dioxide ($SiO_2$), aluminum oxide ($Al_2O_3$), copper oxide ($Cu_2O$), titanium dioxide ($TiO_2$), boron nitride (BN), vanadium oxide ($V_2O_3$), carbon trinitride ($CN_3$), ferroelectric materials and barium-strontium titanate ($(Ba, Sr) TiO_3$).

23. The memory device of claim 1, thicknesses of the first electrode and the second electrode being at least about 0.01 μm or at most about 10 μm.

24. The device of claim 1, the active layer having a thickness of at least about 0.001 μm or at most about 5 μm.

25. The device of claim 1, a thickness of the active layer is about 10 to about 500 times greater than a thickness of the passive layer.

26. A method of fabricating the memory device of claim 1, comprising:
    forming a first electrode on a substrate;
    forming a passive layer of the functional media on the first electrode;
    forming an active layer of the functional media on the passive layer; and
    forming a second electrode on the active layer.

27. The method of claim 26 further comprising forming the active layer via a chemical vapor deposition process.

28. The method of claim 26 further comprising forming the active layer via a gas phase reaction process.

29. The method of claim 26, further comprising forming the active layer formed via a spin coating process or a liquid phase reaction process.

30. The method of claim 26, further comprising applying a first voltage to the first non-copper electrode and the second electrode, to set an impedance state of the organic memory device, the impedance state representing information content.

31. The method of claim 26, further comprising applying a second voltage to the first electrode and the second electrode to determine an impedance state of the memory device, the impedance state representing information content.

32. A memory device comprising:
    a first electrode;
    a functional media formed over the first electrode, the functional media comprising a passive and active layer that exchange electrons or holes to change an impedance state of the memory device and store information content, the impedance state changes based on a migration of electrons or holes when subject to an external electric field or light radiation, the active layer having a thickness that is about 0.1 to about 500 times greater than a thickness of the passive layer, the thickness of the active from about 0.001 μm to about 5 μm and the thickness of the passive layer from about 2 Å to about 0.1 μm; and
    a second electrode formed over the functional media.

* * * * *